United States Patent
Chung et al.

(10) Patent No.: US 6,458,680 B2
(45) Date of Patent: *Oct. 1, 2002

(54) METHOD OF FABRICATING CONTACT PADS OF A SEMICONDUCTOR DEVICE

(75) Inventors: Tae-Young Chung, Suwon; Jae-Goo Lee; Gwan-Hyeob Koh, both of Seoul, all of (KR)

(73) Assignee: Samsung Electronics Co., Ltd., Suwon (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/371,835

(22) Filed: Aug. 11, 1999

(30) Foreign Application Priority Data

Aug. 17, 1998 (KR) .............................................. 98-33302

(51) Int. Cl.⁷ ............................................... H01L 21/44
(52) U.S. Cl. ......................... 438/597; 438/634; 438/637
(58) Field of Search ................................. 438/427, 586, 438/595, 596, 597, 598, 618–620, 621, 624, 622, 634, 647, 637; 257/382, 383, 759, 760

(56) References Cited

U.S. PATENT DOCUMENTS 5,616,960 A * 4/1997 Noda et al. .................. 257/760
5,960,304 A * 9/1999 McAnally et al. ........... 438/597
6,107,196 A * 8/2000 Rolfson ....................... 438/668

* cited by examiner

Primary Examiner—Michael Sherry
Assistant Examiner—Asok Kumar Sarkar
(74) Attorney, Agent, or Firm—Volentine Francos, PLLC

(57) ABSTRACT

An upper insulating layer is formed on a semiconductor substrate, the upper insulating layer having an etch selection ratio relative to a lower insulating layer. The upper insulating layer is anisotropically etched by using a contact pad forming mask, to form an opening exposing an upper surface of the semiconductor substrate between conductive patterns on the substrate. The side walls of the upper insulating layer are then isotropically etched, using the above mask again, to expand the size of the opening. The expanded opening is then filled with a conductive layer to form a contact pad to be electrically connected to the semiconductor substrate.

12 Claims, 5 Drawing Sheets

METHOD OF FABRICATING CONTACT PADS OF A SEMICONDUCTOR DEVICE

BACKGROUND OF THE INVENTION

1. Field of the Invention

The present invention relates to a method of fabricating a semiconductor device, and more particularly to a method of fabricating a contact pad of a semiconductor device.

2. Description of the Related Art

As the density of a DRAM device is increased, the pattern line widths of various elements of the DRAM device are narrowed. Consequently, the aspect ratio becomes larger, and this larger aspect ratio makes it more difficult to form a contact that passes through the insulating layer to the semiconductor substrate. In order to solve this problem, contact pads are utilized, and a conventional process for forming a contact pad is described immediately below.

First, a gate electrode is formed on a semiconductor substrates and the upper surface and the side walls of the gate electrode are covered by a nitride layer. An impurity is implanted into the semiconductor substrate at the both sides of the gate electrode, thereby forming a source/drain region. Then a silicon nitride (SiN) layer is formed on the entire surface of the semiconductor substrate. The SiN layer prevents a device isolating region from being etched during a subsequent etching of an insulating layer in preparation for forming a contact pad. An inter-layer insulating layer is then formed on the SiN layer. Then a photoresist (PR) pattern is used as a mask to etch the inter-layer insulating layer to form an opening which exposes the source/drain region between the gates. The PR pattern is removed and a polysilicon layer is formed on the inter-layer insulating layer to fill the opening. The polysilicon layer is then etched to remove the unnecessary portions of the polysilicon layer. This etching is carried out by employing a Chemical Mechanical Polishing (CMP) process. The CMP process stops at the nitride layer, which covers the gate electrode and which serves as an etch stop layer. In this manner, referred to as a self-aligned contact method, a contact pad is formed.

As a result of this contact pad, the aspect ratio is reduced and the thickness of the insulating layer is decreased. Recall that the insulating layer is etched during the formation of a contact hole for an electrical connection to the contact pad.

This conventional method, however, suffers several drawbacks as explained further below. In the conventional fabricating method, the area of the upper surface of the contact pad is determined by two factors. First, the length of one edge of the upper surface of the contact pad in the direction of the word line is determined by the photoresist PR pattern for forming the contact pad. Second, the length of another edge of the upper surface face of the contact pad in the direction of the bit line is determined by the interval between the word lines. However, the alignment margin of a buried contact (BC) or a direct contact (DC) is determined by the size of the upper surface and by the size of the cell contact. For example, if the design rule of the DRAM cell is 0.15 microns, the maximum size of the pad is 0.15 microns×0.15 microns. If the minimum size of the contact is 0.1 microns, then the alignment margin of the contact relative to the pad is as small as 0.025 microns. However, the present alignment margin for etching processes is 0.05 microns or more, and accordingly, an alignment margin of 0.025 microns is not sufficient, making it difficult to fabricate the pad.

SUMMARY OF THE INVENTION

The present invention seeks to overcome one or more of the above-described drawbacks of the conventional contact pad forming technique.

Accordingly, it is an object of the present invention to provide a method of fabricating a contact pad for a semiconductor device, in which the upper surface area of the contact pad is increased, thereby achieving a sufficient alignment margin between the contact pad and a contact, which is electrically connected to the contact pad.

To achieve this and other objects, the present invention provides a method for fabricating a contact pad for a semiconductor device. The semiconductor device comprises a semiconductor substrate having at least two conductive patterns, and the conductive patterns are covered by a first insulating layer. The method according to the present invention includes: forming a second insulating layer on the semiconductor substrate, the second insulating layer having an etch selection ratio relative to the first insulating layer. The second insulating layer is anisotropically etched using a pad forming mask, to form an opening so as to expose the upper surface of the semiconductor substrate between the conductive patterns. The side walls of the opening in the second insulating layer are then isotropically etched, using the pad forming mask again, to expand the size of the opening. The expanded opening is filled with a conductive layer to form a contact pad to be electrically connected to the semiconductor substrate.

BRIEF DESCRIPTION OF THE DRAWINGS

The above object and other advantages of the present invention will become more apparent by describing in detail a preferred embodiment of the present invention with reference to the attached drawings in which.

DETAILED DESCRIPTION OF THE PREFERRED EMBODIMENT

Figure 1A:
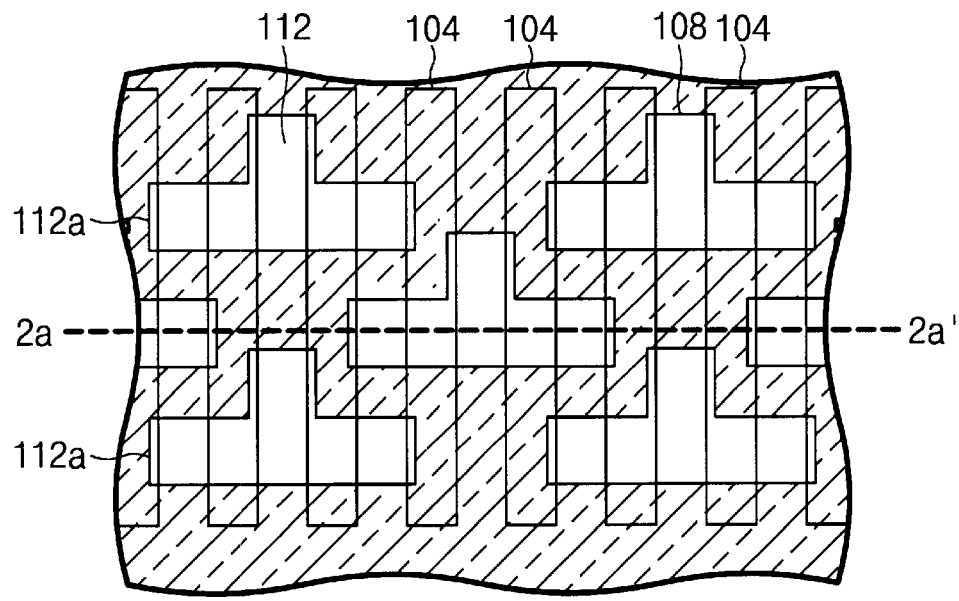
FIGS. 1A to 1C are plan views showing the fabricating process for the contact pad according to the present invention.
Figure 1B:
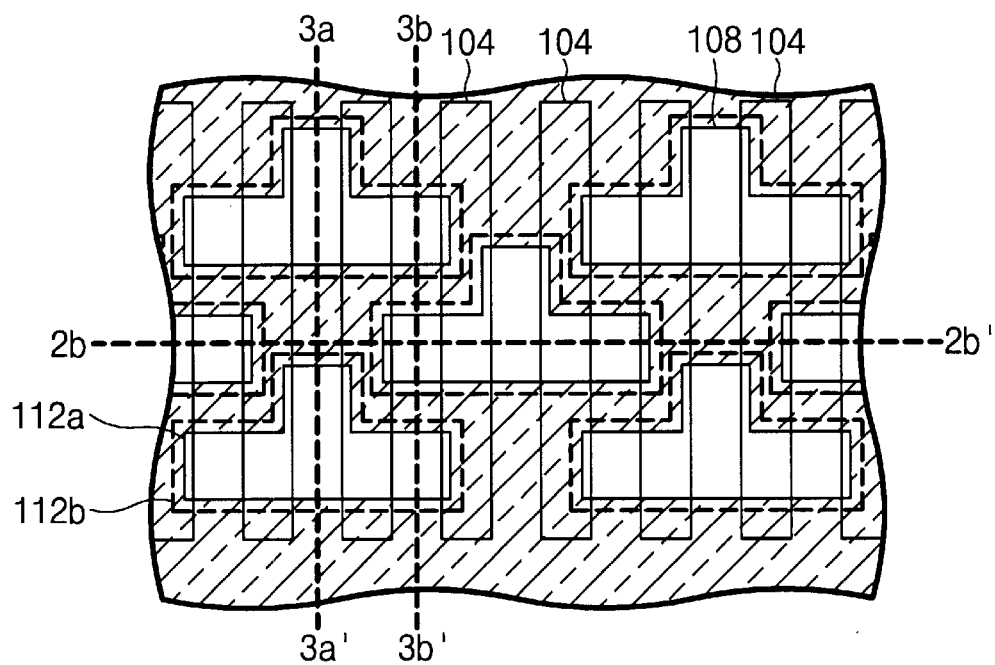
Figure 1C:
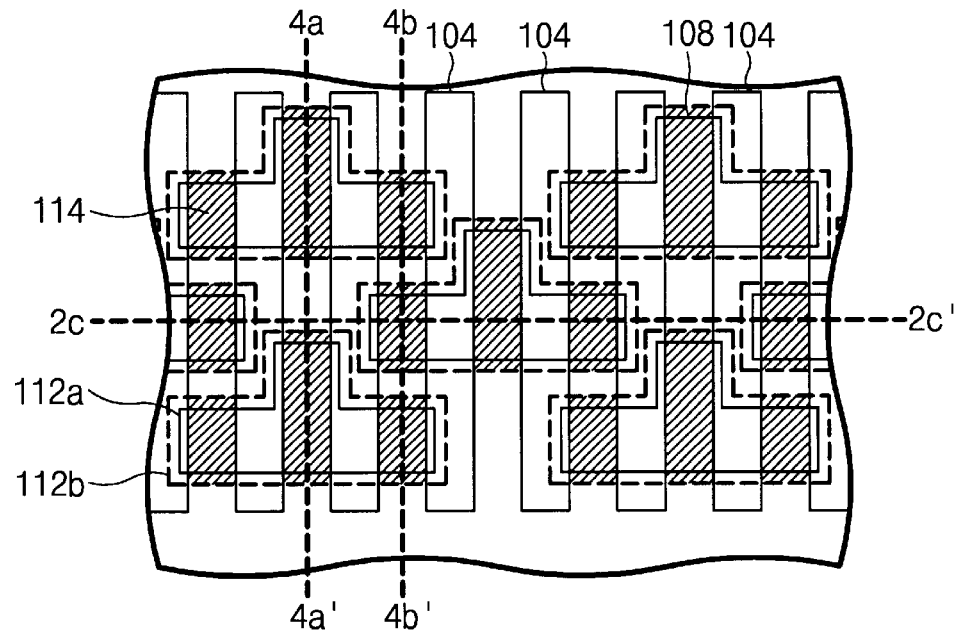
Figure 3A:
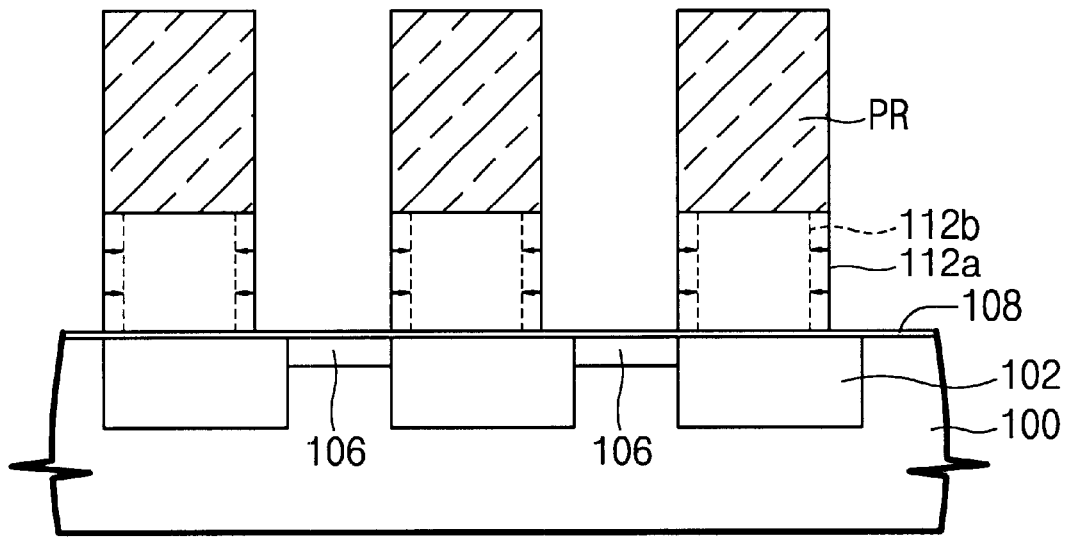
FIG. 3A is a sectional view taken along a line 3a–3a' of FIG. 1B.

Referring first to FIGS. 1C and 3A, the method of fabricating a contact pad for a semiconductor device according to the present invention will be broadly described. Generally, an inter-layer insulating layer is anisotropically etched to create a pad forming opening so as to expose the upper surface of a semiconductor substrate between conductive patterns. Then the side walls of the opening in the inter-layer insulating layer are isotropically etched to expand the size of the opening. Through this novel method, the technical and dimensional limitations of present lithography processes are overcome, and the upper surface area of the contact pad can be expanded. Therefore, the alignment margin between the contact pad and the contact can be increased.

The preferred embodiment of the method of the present invention will be described referring to FIGS. 1A to 1C, 2A to 2C, 3A to 3B, and 4A to 4B.

FIGS. 1A to 1C are plan views showing the fabricating process for the contact pad according to the present invention. More specifically, FIG. 1A is a plan view showing the fabricating process up to the process step of dry-etching the inter-layer insulating layer for forming the contact pad, and FIG. 2A is a sectional view taken along a line 2a–2a' of FIG. 1A.

Figure 2A:
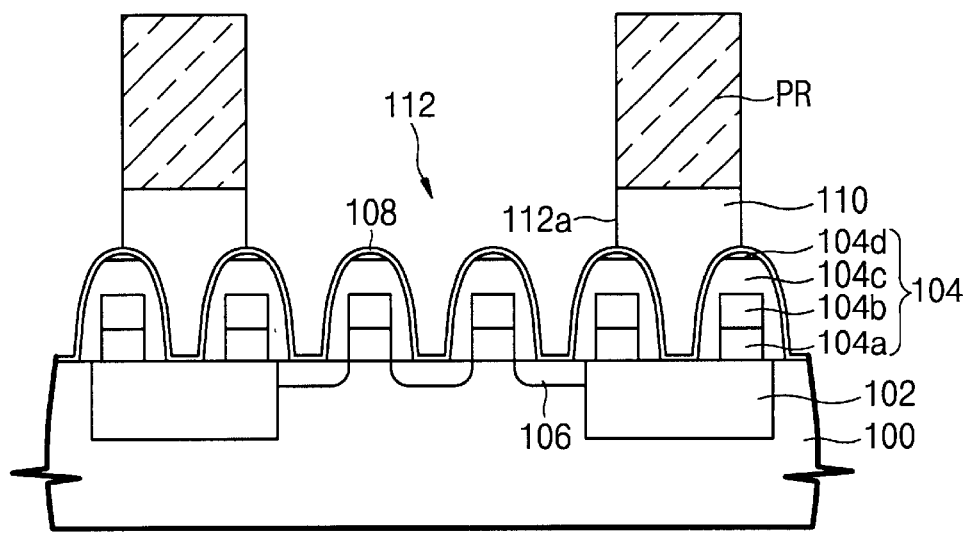
FIG. 2A is a sectional view taken along a line 2a–2a' of FIG. 1A.

Referring to FIGS. 1A and 2A, gate lines 104 are formed on a semiconductor substrate 100, and an inter-layer insulating layer 110 is formed on the semiconductor substrate, covering the gate lines 104. The inter-layer insulating layer may be an oxide layer formed by chemical vapor deposition (CVD), such as a high density plasma (HDP) layer, an Undoped Silicate Glass (USG) layer, or a Borophosphorus Silicate Glass (BPSG) layer. A photoresist(PR) pattern is formed by employing a photo etching process, whereby the PR pattern defines a pad forming region in the vertical direction relative to the gates (i.e., word lines) 104. By using the photoresist PR pattern as a mask, the inter-layer insulating layer 110 is partly etched until the surface of the semiconductor substrate and a part of the gate are exposed, thereby forming an opening 112. The above process will now be described in greater detail.

Referring to FIG. 2A, first a device isolating region 102 is formed on the semiconductor substrate 100 to define an active region and an inactive region. Then, on the semiconductor substrate 100, there are sequentially formed a gate oxide layer (not shown), a polysilicon layer 104a (conductive layer), a tungsten silicide layer 104b, a silicon nitride layer 104c, a high temperature oxide (HTO) layer 104d, a SEC.642 SiON layer (not shown), which acts as an anti-reflective coating (ARC), and a photoresist layer. Also, in order to form a gate line 104, a photoresist pattern (not shown) is formed. By using the photoresist pattern as a mask, etching is carried out on the SiON layer, the HTO layer 104d and the silicon nitride layer 104c to remove certain portions of them. In this manner, another mask is created for forming the gate line 104. The photoresist pattern is removed, and then the tungsten silicide layer 104b, the polysilicon layer 104a, and the gate oxide layer are etched by using the mask which consists of the remaining portions of the SiON layer, the HTO layer and the silicon nitride layer. Thus, there is formed a gate line 104 which consists of the polysilicon layer 104a and the tungsten silicide layer 104b with a silicon nitride capping layer. In this etching process, the SiON layer is completely removed, while the HTO layer 104d partially remains. As is well known, the ARC is formed to facilitate the patterning of the photoresist layer.

A spacer SiN layer is then formed on the entire surface of the semiconductor substrate 100. This spacer SiN layer is anisotropically etched to form SiN spacers on the side walls of the gate electrode, thereby forming a gate line 104 which is covered with the insulating layer 104c comprising the silicon nitride capping layer and the spacer nitride layer. Impurity ions are implanted into the semiconductor substrate 100 and along both sides of the gate line 104, before and after the formation of the spacers. These implanted ions are diffused by the heat released during the formation of the insulating layer and during the heat treatment, thereby forming a source/drain region 106. Then on the entire surface of the semiconductor substrate 100, there are formed a protection SiN layer 108, and a first inter-layer insulating layer (oxide layer) 110 which is any one of HDP, USG, and BPSG layers, formed by the CVD process.

A CMP process is then carried out to flatten or planarize the CVD oxide layer 110. Upon the CVD oxide layer 110, there are sequentially formed an ARC layer (having a thickness of 300–600 Å) and a photoresist layer. Then the photoresist layer is patterned by applying a photo etching process, thereby forming a photoresist PR pattern for defining a pad forming region. Then the ARC layer and the CVD oxide layer 110 are sequentially dry-etched by using the photoresist PR pattern as a mask, thereby forming an opening 112. The protection SiN layer 108 prevents the etching of the oxide layer which forms the device isolating region. Therefore, the breakdown phenomenon of the transistor, which is apt to occur due to the etching of the oxide layer, can be prevented.

The above process steps are generally the same as the conventional process steps, and the description serves as background information for the following discussion.

In the present invention, since a wet etching process is carried out after the dry etching, note that the SiN layer should be prevented from being etched by the dry etching process. Therefore, the dry etching of the CVD oxide layer 110 should be carried out in such a manner that the CVD oxide layer 110 leaves a small enough thickness amount to be easily removed by the later wet etching.

In the above-described structure as formed so far, the side walls 112a of the opening 112, i.e., the side walls of the CVD oxide layer 110, the ARC, and the photoresist PR pattern form a vertically straight line (FIG. 2A). However, in the present invention, the side walls of the CVD oxide layer 110 are further etched to form an enlarged opening. This enlarged opening is then filled with a conductive layer to expand the upper surface area of the contact pad thus formed.

Figure 2B:
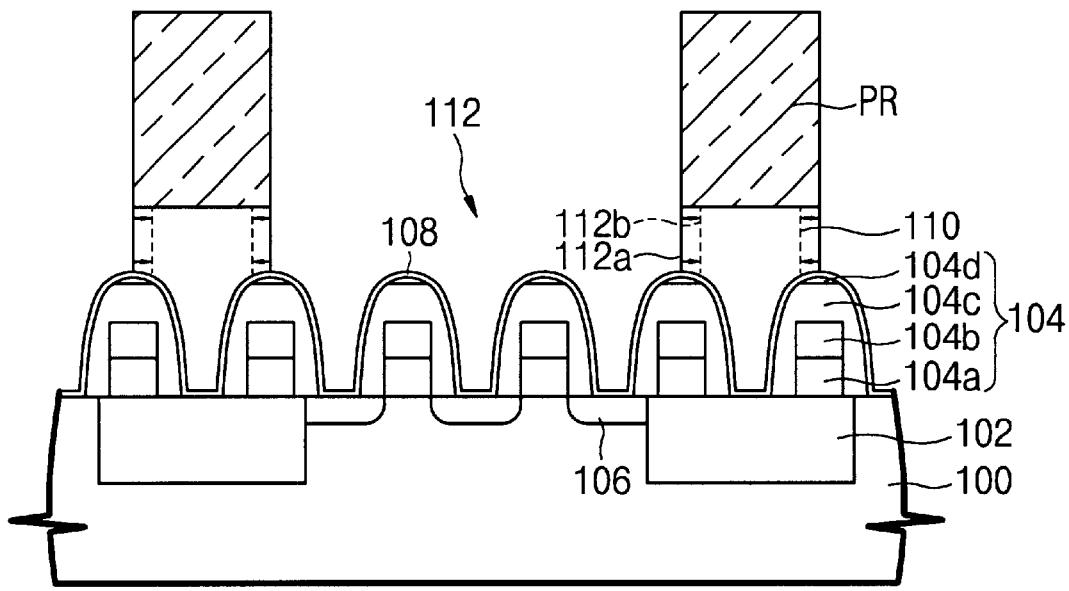
FIG. 2B is a sectional view taken along a line 2b–2b' of FIG. 1B.
Figure 3B:
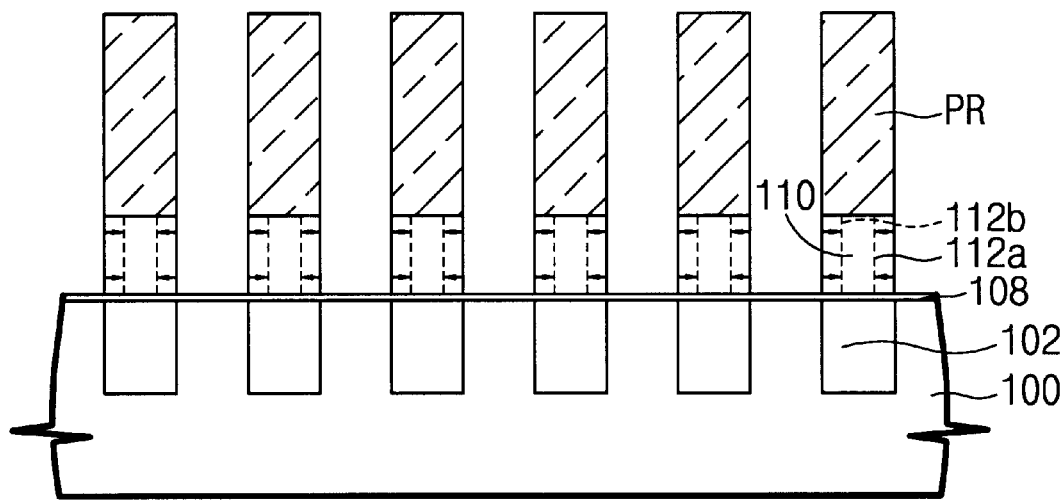
FIG. 3B is a sectional view taken along a line 3b–3b' of FIG. 1B.

More specifically, the final structure of FIG. 2A is subjected to a wet isotropic etching process. FIG. 1B is a plan view of the structure after the wet etching according to the present invention, and FIG. 2B is a sectional view taken along a line 2b–2b' of FIG. 1B. FIG. 3A is a sectional view taken along a line 3a–3a' of FIG. 1B and FIG. 3B is a sectional view taken along a line 3b–3b' of FIG. 1B.

In etching the CVD oxide layer 110, a wet isotropic etching is carried out using a solution containing: deionized (DI) water and HF at a ratio of 100:1 to 1000:1, and one of an SC1 cleaning solution comprising $H_2O_2$, $NH_4OH$ and $H_2O$ at a ratio of 4:1:20, an SC2 cleaning solution comprising $H_2O_2$, HCl and $H_2O$ at a ratio of 1:1:6, or a combination of the SC1 and SC2 cleaning solutions (i.e., an RCA cleaning solution). In this wet etching process, only the side walls 112a of the CVD oxide layer 110 within the opening 112 are etched, and the CVD oxide layer 110 (i.e., along its side walls) is preferably etched at a rate of 500 Å/min. This wet etching procedure is timed, and removes the photoresist layer by using the ARC and SiON layer as a mask. The etching is continued until the side walls of the CVD oxide layer 110 are etched by about ¼ of the gate width, which satisfies the desired design rule. If the etching exceeds the ¼ of the gate width, then an oxide layer breakdown may occur between the contact pads, and therefore the insulation between the contact pads collapses. After the wet etching process, the side walls of the opening are as indicated by the dotted lines 112b in FIGS. 1B and 2B.

As shown in FIG. 1B, the dotted lines 112b are expanded in the directions of the word lines and bit lines, and as shown in FIG. 2B, the side walls 112b are expanded below the photoresist PR pattern. Referring to FIG. 3B, the opening is expanded from the conventional side walls 112a to new side walls 112b along the word lines 104. As a result of the wet etching, the protection SiN layer is exposed at a place where the contact pad is to be formed.

Figure 2C:
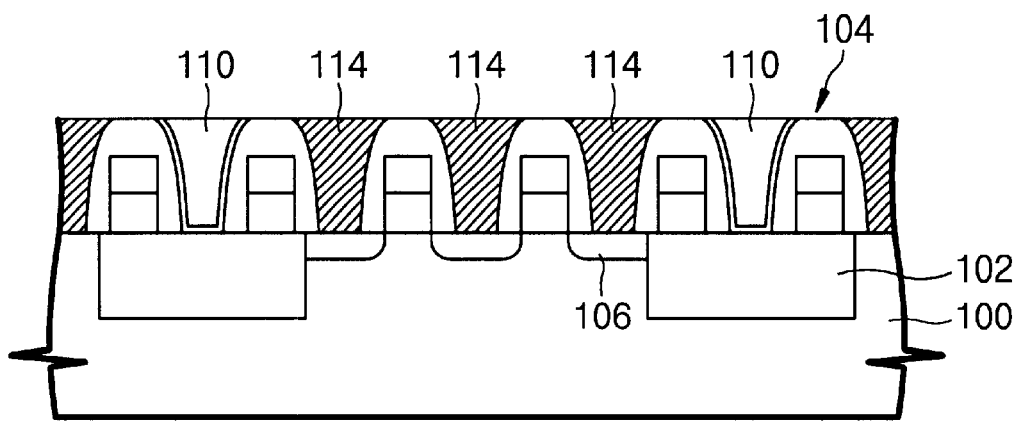
FIG. 2C is a sectional view taken along a line 2c–2c' of FIG. 1C.

FIG. 1C is a plan view showing the final structure in which the contact pad is formed by filling the opening with a conductive layer, and FIG. 2C is a sectional view taken along a line 2c–2c' of FIG. 1C.

Referring to FIG. 2C, the exposed protection SiN layer is removed by a well known etching process, with the result that the upper surface of the source/drain region 106 of the contact pad forming region is exposed. Further, the ARC layer and the photoresist layer which have been used as a mask are removed. Then a conductive layer, e.g., a polysilicon layer, is formed on the CVD oxide layer 110, that is, the first inter-layer insulating layer, to fill the opening 112. Then a CMP process or an etch-back process is carried out by using the SiN layer 104c as an etch stop layer. Thus the unnecessary polysilicon layer and the first inter-layer insulating layer 110, which is positioned higher than the gate 104, are removed, thereby forming a contact pad 114. In FIG. 1C notice that the contact pad 114 does not expand in the bit line direction. Although there is no expansion of the contact pad 114 in the bit line direction, the contact pad 114 does expand in the word line direction, as seen in FIG. 1C by comparing the conventional solid lines 112a to the dotted lines 112b as viewed along the word line direction.

Figure 4A:
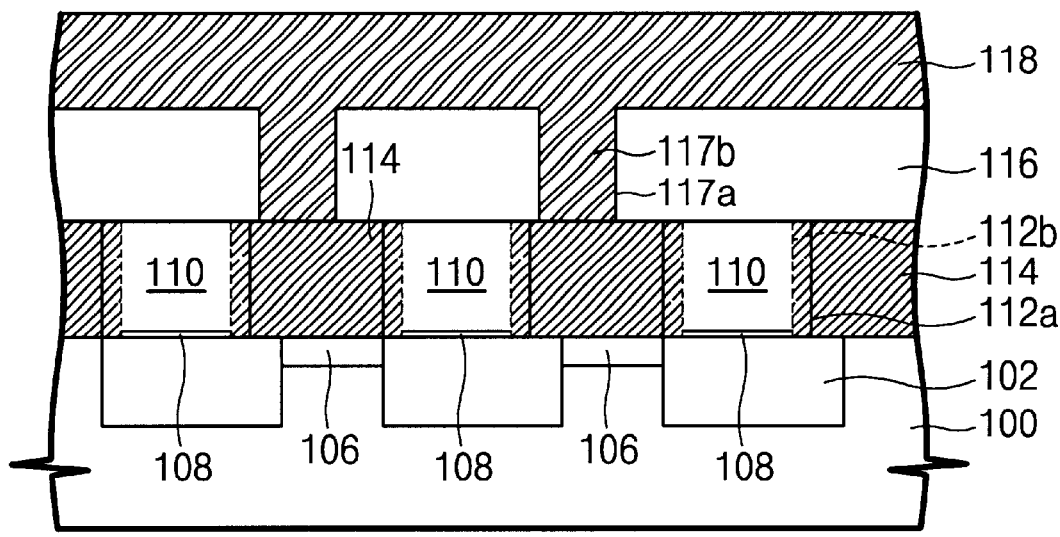
FIG. 4A is a sectional view taken along a line 4a–4a' of FIG. 1C, after forming the bit line.

FIG. 4A is a sectional view taken along a line 4a–4a' of FIG. 1C, after forming the bit line. Referring to FIG. 4A, a second inter-layer insulating layer 116 is formed on the first inter-layer insulating layer 110, covering the contact pad 114. Then the second inter-layer insulating layer 116 and the first inter-layer insulating layer 110 are partly etched by using the photoresist pattern (for defining a direct contact (DC) forming region 117b) as a mask, thereby forming a DC hole 117a to expose the contact pad. Then on the second inter-layer insulating layer 116, there is formed a bit line 118 which is electrically connected through the DC hole 117a to the contact pad 114. Owing to the expansion of the contact pad 114 in the direction of the word line 104, the alignment margin is significantly increased between the DC 117b and the contact pad 114. That is, an alignment margin of about 0.05 microns is secured. Here again, in FIG. 4A, the dotted lines 112b indicate the side walls of the opening after their enlargement by the wet etching of the CVD oxide layer 110, and the solid lines 112a indicate the conventional side walls of the opening before the wet etching.

Figure 4B:
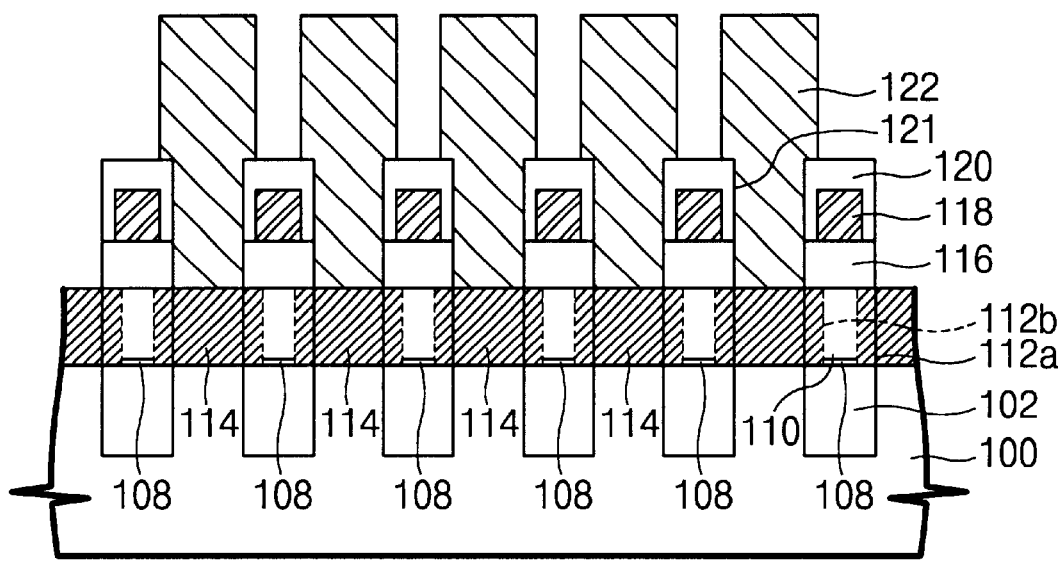
FIG. 4B is a sectional view taken along a line 4b–4b' of FIG. 1C, after forming the lower electrode of a capacitor.

FIG. 4B is a sectional view taken along a line 4b–4b' of FIG. 1C, after forming the lower electrode of a capacitor.

Referring to FIG. 4B, a third inter-layer insulating layer 120 is formed on the second inter-layer insulating layer 116, covering the bit line 118. Then the third inter-layer insulating layer 120 and the second inter-layer insulating layer 116 between the bit lines 118 are partly etched by using the photoresist pattern (for defining a BC forming region) as a mask. Thus a BC 121 is formed which exposes the surface of the contact pad 114. In this case, the bit line 118 is covered by an insulating layer which has an etch selection ratio relative to the inter-layer insulating layers. Therefore, the bit line 118 is not exposed by the etching, and accordingly, there is no possibility that a short circuit may be formed with the BC 121. Then the photoresist pattern is removed, after which a lower electrode 122 of a capacitor is formed, which is electrically connected through the BC 121 (in the third inter-layer insulating layer 120) to the contact pad 114. If this final structure is cut along the line 4a–4a' of FIG. 1C, it would appear as depicted in FIG. 4A.

According to the present invention as described above, the upper surface area of the contact pad is expanded, thereby overcoming the technical and dimensional limitations of the current lithography process. Accordingly, a large alignment margin can be secured between the contact pad and the BC or DC during the formation of the BC or DC which is electrically connected to the contact pad.

What is claimed is:

1. A method for fabricating a semiconductor device, comprising:

providing a semiconductor substrate including a surface, at least first and second elongate conductive patterns extending parallel to each other in a first direction along the surface of the semiconductor substrate, and a first insulating layer, wherein the first insulating layer includes a first portion covering the first conductive pattern such that an upper surface of the first portion extends over an upper surface of the first conductive pattern and a side surface of the first portion extends along a side of the first conductive pattern, and a second portion covering the second conductive pattern such that an upper surface of the second portion extends over an upper surface of the second conductive pattern and a side surface of the second portion extends along a side of the second conductive pattern, wherein the first and second portions of the first insulating layer are spaced apart from each other in a second direction to define a gap between the side surfaces thereof, the second direction being perpendicular to the first direction;

forming a second insulating layer over an entirety of the surface of the semiconductor substrate including over the first insulating layer and within the gap between the side surfaces of the first and second portions of the first insulating layer;

etching the second insulating layer to form an opening therein that extends vertically towards the surface of the semiconductor substrate and horizontally in the first and second directions, wherein opposite first sidewalls of the opening extend in the first direction and are located over the upper surfaces of the first and second portions of the first and second insulating layer, respectively, and wherein opposite second sidewalls of the opening extend in the second direction between the first and second portions of the second insulating layer;

isotropically etching the sidewalls of the opening in the second insulating layer to expand a width of the opening in the first and second directions;

forming a conductive layer over an entirety of the surface of the semiconductor substrate including over the second insulating layer and within the expanded opening of the second insulating layer; and planarizing the conductive layer and the second insulating layer until the upper surfaces of the first and second portions of the first insulating layer are exposed, wherein the conductive layer remaining after said planarizing forms a contact pad located between the first and second conductive patterns.

2. The method as claimed in claim 1, wherein the first insulating layer is a nitride layer and the second insulating layer is an oxide layer.

3. The method as claimed in claim 2, wherein the second insulating layer is made of an oxide material selected from the group consisting of Undoped Silicate Glass (USG), Borophosphorus Silicate Glass (BPSG), and high density plasma (HDP).

4. The method as claimed in claim 3, wherein the second insulating layer is formed by a Chemical Vapor Deposition (CVD) process.

5. The method as claimed in claim 1, wherein said isotropically etching includes using an etching fluid having an etching rate capacity of 500 Å/min.

6. The method as claimed in claim 5, wherein the etching fluid is a solution comprising deionized (DI) water and HF at a ratio of 100:1 to 1000:1, and a cleaning solution.

7. The method as claimed in claim 6, wherein the cleaning solution is one of a SC1 cleaning solution, an SC2 cleaning solution, and a RCA cleaning solution.

8. The method as claimed in claim 6, wherein the first and second conductive patterns are gate electrodes, and wherein an amount of each of the side walls of the second insulating layer that is removed by said isotropic etching is at most equal to about one-quarter of a gate width of the semiconductor device.

9. The method as claimed in claim 1, wherein the opening in the second insulating layer is formed by anisotropic etching of the second insulating layer.

10. The method as claimed in claim 1, further comprising forming a protective layer over the conductive patterns and over the semiconductor substrate prior to forming the second insulating layer, and removing the protective layer after isotropically etching the side walls of the opening of the second insulating layer.

11. The method as claimed in claim 10, wherein the protective layer comprises a nitride layer and the second insulating layer comprises an oxide.

12. The method as claimed in claim 1, wherein the first and second conductive patterns comprise respective first and second gate electrodes extending parallel to one another in a word line direction of the semiconductor device.

* * * * *